United States Patent [19]

Sher

[11] 4,152,597
[45] May 1, 1979

[54] APPARATUS INCLUDING EFFECTIVELY INTRINSIC SEMICONDUCTOR FOR CONVERTING RADIANT ENERGY INTO ELECTRIC ENERGY

[76] Inventor: Arden Sher, 108 Charles River Landing Rd., Williamsburg, Va. 23185

[21] Appl. No.: 848,653

[22] Filed: Nov. 4, 1977

Related U.S. Application Data

[63] Continuation-in-part of Ser. No. 710,296, Jul. 30, 1976, Pat. No. 4,058,729, which is a continuation-in-part of Ser. No. 632,090, Nov. 14, 1975, abandoned.

[51] Int. Cl.² .............................................. G01T 1/22
[52] U.S. Cl. ............................... 250/370; 136/89 SG; 250/338
[58] Field of Search ............... 250/336, 338, 340, 341, 250/347, 349, 353, 370, 371; 136/206, 213, 89 SG

[56] References Cited

U.S. PATENT DOCUMENTS

| | | | |
|---|---|---|---|
| 3,450,879 | 6/1969 | Seppi | 250/370 X |
| 3,851,174 | 11/1974 | Tynan et al. | 250/336 |
| 3,932,753 | 1/1976 | Stotlar | 250/370 X |
| 3,949,210 | 4/1976 | Eichinger et al. | 250/370 |
| 3,985,685 | 10/1976 | Houlton et al. | 250/370 X |

*Primary Examiner*—Davis L. Willis
*Attorney, Agent, or Firm*—Lowe, King, Price & Becker

[57] ABSTRACT

Radiant energy is converted into electric energy by irradiating a capacitor including a layer of an intrinsic or lightly doped semiconductor, having a face on which an insulating layer is provided. First and second metallic contacts are respectively provided on the insulating layer and semiconductor. The radiant energy cyclically irradiates an interface of the semiconductor and the insulating layer to produce electron hole pairs in the interface surface of the semiconductor and thereby cause cyclic changes in the capacitance and resistance of the capacitor. The capacitor is initially charged to a voltage just below the breakdown voltage of the insulating and semiconductor layers by temporarily connecting it across a DC source to cause a current to flow through a charging resistor to the capacitor. The device can be utilized as a radiant energy detector, as well as a solar energy cell.

22 Claims, 3 Drawing Figures

APPARATUS INCLUDING EFFECTIVELY INTRINSIC SEMICONDUCTOR FOR CONVERTING RADIANT ENERGY INTO ELECTRIC ENERGY

FIELD OF THE INVENTION

The present invention relates generally to apparatus for converting radiant energy into electric energy and particularly to an apparatus including a capacitor having an intrinsic or lightly doped semiconductor layer and an insulating layer on the semiconductor layer.

RELATIONSHIP TO OTHER APPLICATIONS

The present application is a Continuation-in-Part of my co-pending application Ser. No. 710,296, filed July 30, 1976, now U.S. Pat. No. 4,058,729, which in turn is a Continuation-in-Part of application Ser. No. 632,090, filed Nov. 14, 1975, now abandoned.

BACKGROUND OF THE INVENTION

Devices for converting radiant energy, such as optical energy, into electric energy presently generally take two forms, viz.: (1) semiconductors relying upon a barrier layer mechanism, and (2) pyroelectric devices wherein a ferroelectric is cyclically heated and cooled to provide corresponding changes in the capacitance and resistance of a capacitor including the ferroelectric.

Typically, the barrier layer semiconductor devices have relatively heavy doped semiconductor layers with energy gaps that, in essence, absorb certain wavelengths of interest and convert the energy of the absorbed wavelengths into electric energy. These devices are utilized as radiant, optical energy detectors for specific wavelengths of interest, as well as power generating solar cells. The major disadvantage of the semiconductor devices as radiant energy detectors is that the semiconductor element must usually be maintained at cryogenic temperatures to function effectively. It is frequently difficult to maintain a semiconductor device at a cryogenic temperature, whereby the usefulness of semiconductor radiant energy detectors is often limited. The major disadvantage of the semiconductor devices as solar energy converters is that such devices are relatively inefficient in converting the solar energy into electrical energy. The typical, actual maximum efficiency of such converters is generally on the order of 10%.

Pyroelectric devices are generally characterized by a ferroelectric dielectric that is positioned between a pair of electrodes to form a capacitor responsive to the optical energy. Typically, the ferroelectric material is periodically heated and cooled to cause a periodic variation in the capacitance and resistance of the capacitor. Since the ferroelectric materials have dipole layers extending completely through the dielectric, i.e., from one electrode to the other electrode, the dielectrics are strongly piezoelectric, making them sensitive to vibrations. Thereby, the pyroelectric detectors have a tendency to be noisy and frequently have relatively low signal to noise ratio outputs. In addition, the pyroelectric detectors often have detectivities below the level of the radiation impinging on the dielectric, thereby limiting their application in many systems.

In my copending application entitled "Apparatus For Converting Radiant Energy Into Electric Energy", Ser. No. 631,689, filed Nov. 13, 1975, there is disclosed an improved radiant energy detector and solar energy converter having higher detectivity and sensitivity than prior art detectors and greater efficiency than prior art energy converters. In the device disclosed in my co-pending application, a capacitor includes an ionic dielectric having a dipole layer only on or near the dielectric surface. The dielectric is generally selected from the group consisting of the rare earth trifluorides and trichlorides, and is preferably lanthanum trifluoride. A possible problem with the use of this class of materials is that it has relatively low breakdown voltages, on the order of 5 to 10 volts, regardless of the thickness of the dielectric layer; the breakdown voltage is dependent exclusively upon the dielectric material. A further possible disadvantage of the device disclosed in the co-pending application may be the difficulty of obtaining the specified rare earth trifluorides and trichlorides.

In Ser. No. 710,296, there is disclosed a device for converting radiant energy into electric energy which includes a capacitor responsive to the radiant energy, wherein the capacitor comprises a layer of an intrinsic or lightly doped semiconductor and at least one and preferably two insulating layers on the semiconductor layer. If the semiconductor is lightly doped, to increase the breakdown voltage of the capacitor, the doping is light enough that the semiconductor layer still functions effectively as an intrinsic layer. Intrinsic semiconductor layers, e.g., of germanium or silicon, with deep doped donors or acceptors, to a concentration of approximately $10^{17}$ to $10^{18}$ per cm$^3$, or with shallow doped donors to a concentration of approximately $10^{13}$ to $10^{14}$ per cm$^3$ are considered to be effectively intrinsic semiconductor layers. (Shallow donors or acceptors, by definition, are impurities having ionization energies small enough so they are completely ionized at room temperature. Thus for them there is a one-to-one correspondence between the impurity concentration and the carrier concentration. However, deep donors and acceptors, by definition, are not completely ionized at room temperature, so for them there is not a one-to-one correspondence with the carrier concentration.) The device is provided with a pair of contacts that are preferably formed as metallic contacts on the first and second insulating layers. There are no junction-type barrier layers in the semiconductor layer or between the insulating layers and the metal contacts; the only barrier layers reside at the interfaces between the semiconductor and the insulating layers. Such a configuration has an equivalent circuit including a pair of series capacitors having values commensurate with the capacitance of each of the insulating layers, a series resistor having a value equal to the semiconductor resistance, and a further pair of series capacitors having values equal to the capacitance of a pair of depletion and accumulation layers of the intrinsic semiconductor. In a case (Case I), corresponding to a low charging voltage, for a specified ambient temperature, three cases can be distinguished as a function of charging voltage applied between the contacts. The depletion and accumulation layers have effective thicknesses equal to the Debye shielding length of the semiconductor at each of its intersections with the insulating layers. In a second case (Case II), the voltage is large enough to form a depletion layer having a thickness exceeding the Debye shielding length and substantially smaller than the semiconductor thickness. For the third case (Case III), the voltage is so large that the depletion layer occupies practically the whole semiconductor thickness. The preferred operating conditions correspond to Cases I or II. The device will operate if they are biased into inversion.

Preferably, the device of the prior art, as disclosed in Ser. No. 710,296, now U.S. Pat. No. 4,058,729, utilizes any of the well known, and generally available, intrinsic semiconductors, such as silicon, germanium, gallium arsenide, diamond, silicon carbide and gallium phosphide; also, the insulating layers are preferably formed as oxides of the intrinsic semiconductor. The intrinsic semiconductors can be charged to relatively large voltages, on the order of 30 volts, without breaking down while still operating in Cases I and II defined earlier. Thereby, the devices of Ser. No. 710,296 can be initially charged to a higher voltage level than the devices described in my copending application, Ser. No. 631,689, thereby possibly providing greater detectivity with the device of the present invention than the device disclosed in the prior patent application. By utilizing lightly doped semiconductors, as described supra, the initial charging voltage can be increased further without causing breakdown of the semiconductor layer.

The resistance and capacitance of the intrinsic or lightly doped semiconductors vary in an exponential manner for Cases I and II in accordance with:

$$C = C_o e^{-E_c/kT} \tag{1}$$

$$R = R_o e^{E_r/kT} \tag{2}$$

where:
$C_o$ = static capacitance of the capacitor at high temperature, i.e., $kT \gg E$,
$R_o$ = the static, series resistance of the capacitance at high temperature, i.e., $kT \gg E$,
$E_c$ = the activation energy for the temperature dependent capacitance of the capacitor,
$E_r$ = the activation energy of the temperature dependent resistance of the capacitor,
$k$ = Boltzmann's constant, and
$T$ = temperature in degrees Kelvin. Hence, by cyclically increasing and decreasing the temperature of the dielectric, by chopping radiation from a source of interest or solar radiation, the capacitance of the dielectric respectively increases and decreases, while the resistance of the dielectric respectively decreases and increases.

BRIEF DESCRIPTION OF THE PRESENT INVENTION

As a result of experiments with the structure disclosed in Ser. No. 710,296, I have now unexpectedly determined that there are exponential relationships similar to Equations (1) and (2) if there is irradiation of an interface between the semiconductor and dielectric layers of a metal, insulating, semiconductor capacitor structure similar to that described in Ser. No. 710,296. In the exponential equations, radiation intensity is generally substituted for temperature, and the mechanism of the present invention is referred to herein as a photo-capacitive effect. Hence, in accordance with the invention, there is no need to provide a layer that absorbs radiation and converts it to heat that cyclically increases and decreases the dielectric temperature. Instead, the interface is irradiated directly by a chopped source; it is believed that electron hole pairs are created at the interface in response to the chopped radiation. In the photo-capacitive effect, the photon energy of a photon incident on the interface must be high enough to create electron-hole pairs in the semiconductor, i.e., be greater than the band gap energy of the semiconductor. Given this circumstance, the radiation modulates the electron temperature rather than the temperature of the whole sample. Hence, the carrier concentration of the semiconductor and the capacitance of the device are modulated and a signal generated in response. The invention has advantages similar to those disclosed in Ser. No. 710,296, now U.S. Pat. No. 4,058,729, relative to breakdown voltage.

While the mechanism of the invention is quite satisfactory for solar cell devices made of silicon, it has an obvious disadvantage for infrared detectors because only photons with energy greater than the bank gap energy are effective. This effect has been observed in Ge, Si and GaAs and is expected to exist in narrow band gap materials. The responsivity of devices in the photo-capacitive mode are quite large, in the approximate range of 10 to 1000 volts per watt of incident energy and high normalized detectivities are expected, based upon present experimental data with Ge as the semiconductor. However, a significant feature of the photo-capacitive development, and from similar observations in Si and GaAs, is the realization that the same phenomena are likely in narrower band gap semiconductor materials, e.g., InSb, PbSnTe, CdHgTe and PbS. Such narrow band gaps will provide infrared detectors with a high detectivity, operating at room temperature in useful frequency intervals. Solar cells constructed from photo-capacitive devices also look promising.

I am aware that metal insulating semiconductor (MIS) devices have previously been irradiated with optical energy to test the MIS devices. It is also known that there are similarities in the temperature and radiation properties of MIS devices; see Physics of Semiconductor Devices (1969), S.M. Sze, pgs. 448, 473 and 475. Despite these prior art developments, I am unaware of MIS devices having been used for solar energy converter or optical energy detection applications.

It is, accordingly, an object of the present invention to provide a new and improved optical device for converting radiant energy into electric energy.

Another object of the invention is to provide a new and improved solar energy converter.

A further object of the invention is to provide a new and improved optical radiation to electric energy converter wherein the converter is capable of supplying increased voltage to a load.

Yet another object of the invention is to provide a new and improved optical radiant energy to electric energy converter wherein the device includes a dielectric that can be charged to a relatively high, initial voltage.

Still another object of the invention is to provide a new and improved optical radiant energy to electric energy converter employing generally available intrinsic or lightly doped semiconductors.

An additional object is to provide a new and improved radiant energy detector employing a photo-capacitive effect.

The above and still further objects, features and advantages of the present invention will become apparent upon consideration of the following detailed description of several specific embodiments thereof, especially when taken in conjunction with the accompanying drawing.

DETAILED DESCRIPTION OF THE DRAWING

Figure 1:
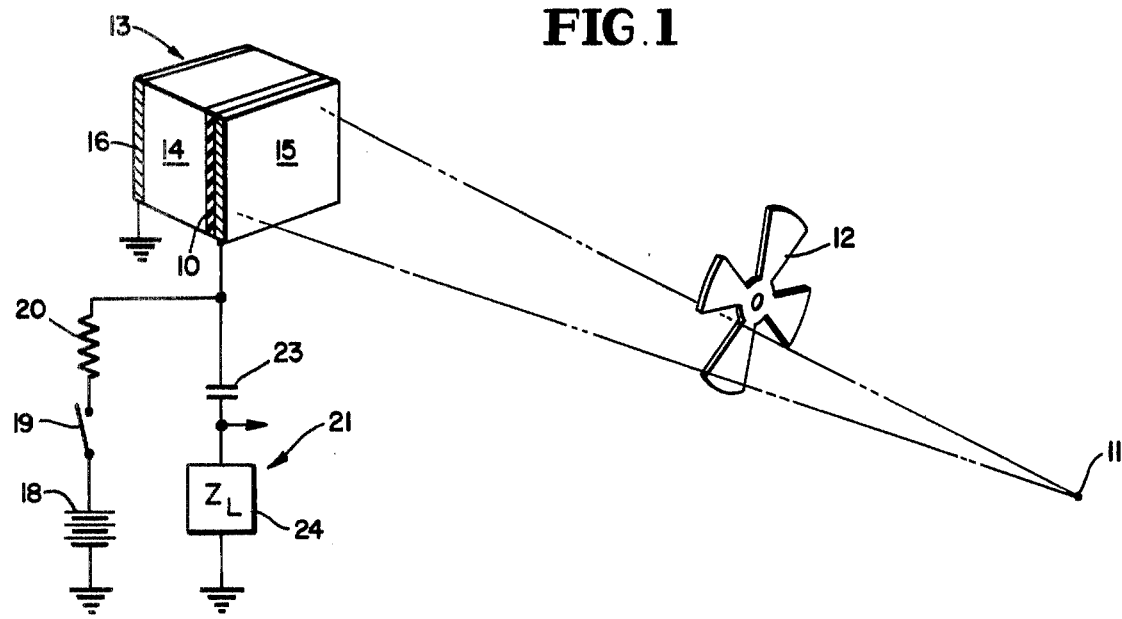
FIG. 1 is a partially schematic and partially perspective view of the invention as employed as a radiant energy detector.

Reference is now made to FIG. 1 of the drawing wherein radiant energy from a suitable source is cyclically interrupted by chopper 12 so that the energy illuminates detector 13. Chopper 12 is rotated at a constant rate so that radiation from source 11 illuminates detector 13 at a predetermined, constant frequency. Detector 13 is maintained at room temperature and is effectively a variable capacitor including a solid, intrinsic or effectively intrinsic, i.e., lightly doped, semiconductor layer or substrate 14, typically having a thickness of about 20 microns and a face on which is formed relatively thin electrically insulating layer 10 that is transparent to the radiant energy of source 11. On the exposed faces of layers 10 and 14 are metallic contacts that respectively form electrodes 15 and 16 of the variable capacitor. Layer 15 is a film thin enough to be transparent to the radiant energy of source 11. While electrode 15 is illustrated as a solid metal electrode through which radiation from source 11 passes, that electrode preferably includes openings which permit light to strike layers 10 and 14, without having to pass through the metal, in order to achieve higher detectivities.

Conventional electrode patterns, as employed in standard photovoltaic solar cells, would appear to be optimum patterns for electrode 15. Typically, these patterns have metal areas of 6%, with the remainder of the pattern open to layer 10. Also, antireflection coatings, transparent to the radiation from source 11, are preferably formed on semiconductor 14; insulating layer 10 may serve as a partial antireflecting coating if the thickness of layer 10 is adjusted properly. Hence, the interface between layer 14 and dielectric layer 10 is alternately and periodically irradiated by and is not irradiated by radiant energy from source 11 at a frequency determined by the chopper rotation rate.

The band gap of electrons in semiconductor layer 14 must have an energy level that is less than the energy of a photon from source 11 which is incident on the interface between layers 10 and 14. Hence, to detect infrared and relatively long wavelength radiant energy from source 11, for detection purposes, semiconductor substrate 14 is formed of narrow band gap materials, such as indium antimonide, indium arsenide, lead selenide, lead tin telluride, cadmium mercury telluride, and lead sulfide. Materials with narrow band gaps, such as the named intrinsic and lightly doped semiconductor materials, provide infrared detectors with high detectivity, operating at room temperature. It is believed that electron hole pairs are created in semiconductor 14 at the interface between the semiconductor and layer 10 in response to the radiation from source 11. It is postulated that the radiation modulates the temperature of electrons in semiconductor 14 to provide modulation of the carrier concentration of semiconductor 14 so that a variable capacitance is provided between electrodes 15 and 16.

Variable capacitor 13 is formed so that no junction layer exists between layers 10 and 14, or between electrode 15 and layer 10, or between electrode 15 and layer 14. Electrodes 15 and 16 are formed as ohmic contacts on layer 10. To these ends, it was found that several different techniques could be utilized to form layer 10 on substrate 14. In particular, layer 10 could be formed by oxidizing the face of semiconductor layer 14 on which the insulating layer is formed or the insulating layer could be deposited in a plasma, or sputtered. In addition, if either germanium or gallium arsenide is used as semiconductor layer 14, for detecting relatively short wavelength sources, the insulating layer can be formed by anodizing the germanium. The insulating layer can also be a vacuum deposited lanthanum trifluoride film or some other superionic conductor that forms blocking contacts. (The term "superionic conductor" refers to dielectrics having resistivities of less than $10^7$ ohm.cm at approximately room temperature. Superionic conductors are discussed in detail in the publications "Conference on Superionic Conductors, Chemistry, Physics and Applications," G.E. Research & Development Center, 1976, published by Plimm, New York, and "Advanced Study Institute on Fast Ion Transport in Solids, Solid State Batteries & Devices," Belgirate, Italy, Sept. 1972, published by American Elsevier, New York, 1973.)

If insulating layer 10 is an oxide layer of semiconductor layer 14, it may be formed by firing the face of layer 14 on which layer 10 is formed. In one embodiment, oxidizer layer 10 is approximately 250 to 1000 Å thick, while electrode 15 has a thickness on the order of 100 Å. Preferably, electrode, i.e., contact 15, is formed by vacuum vapor depositing silver or gold on layer 10. In any event, electrode 15 and layer 10 must be thin enough and formed of materials to enable them to be transparent to radiation from source 11 so the radiation can irradiate the interface between layers 10 and 14. In response to the cyclic radiation of the interface between layers 10 and 14 by the chopped radiation from source 11, there is a corresponding increase and decrease of the electron temperature at the interface to vary the capacitance and resistance of semiconductor 14 in accordance with Equations (1) and (2).

Prior to the device being put into operation, a charge is established between electrodes 15 and 16 across layers 10 and 14. To this end, electrode 15 is initially connected to DC source 18 through switch 19 and current limiting resistor 20. The circuit is completed by connecting source 18 and resistor 20 to ground, as well as by connecting electrode 16 directly to ground. The voltage of source 18 is selected such that there is no breakdown of semiconductor layer 14 and an electric field is established across layer 14. Also, source 18 causes a depletion layer to be formed in the portion of layer 14 abutting the interface between layers 10 and 14. A Debye shielding length at the interface has a length into layer 14 much greater than the thickness of layer 10. It is desired to provide as high an initial voltage as possible between electrodes 15 and 16, without achieving breakdown, so that a substantial current is derived from detector 13 in response to the periodic irradiation by source 11 of semiconductor layer 14. In a typical configuration, where layer 14 is intrinsic semiconductor silicon having a thickness of 20 microns, the voltage applied by source 18 to electrodes 15 and 16 is approximately 20 volts.

After the initial voltage has been applied across semiconductor layer 14 and insulating layer 10 by DC source 18, switch 19 is opened and the alternate irradiation of the semiconductor layer causes an AC current to be supplied by detector 13 to external load circuit 21. If resistor 20 is large enough so no substantial AC current flows in the charging circuit, switch 19 can be left closed. Load circuit 21 includes resistive load impedance 24 that is series connected to electrode 15 and a relatively large blocking capacitor 23 that prevents discharge of detector 13. Load impedance 24 is series connected to electrode 16 via a ground connection and has a relatively large, resistive value so that maximum voltage can be developed across it and applied to input terminals of an AC amplifier (not shown) that drives a synchronous detector (not shown) responsive to the frequency of the chopped radiation from source 11.

The device illustrated in FIG. 1 has been found to have very high detectivities and responsivities. In particular, one device wherein layers 10 and 14 were respectively silicon dioxide and germanium, had a detectivity of $2 \times 10^9$ W·cm·(Hz)$^{\frac{1}{2}}$, and a responsivity of approximately 150 V/W for photon energy just above the band gap energy of germanium. The device that was fabricated and which had these characteristics was a relatively crude device and it would not be surprising if the detectivity could be improved by at least a factor of 10. Devices fabricated of gallium aresenide semiconductors with an anodized insulating layer have been found to have enormous responsivities of approximately $5 \times 10^3$ V/W with a photon flux of 10 MW/cm$^2$.

The metal insulating layer, effectively intrinsic semiconductor (MIS) device of the present invention can also be employed as a solar energy converter cell. Such a converter employs a semiconductor layer 14 having a relatively high band gap, whereby materials such as germanium, silicon, and gallium arsenide are preferably employed for this application. Such a converter preferably employs a load circuit resonant to the illumination frequency of the cell by radiation from a solar source. The converter preferably includes an array of cells, each of which is illuminated with different phases so that at least one of the cells in the array is illuminated at all times, to provide maximum efficiency.

Figure 2:
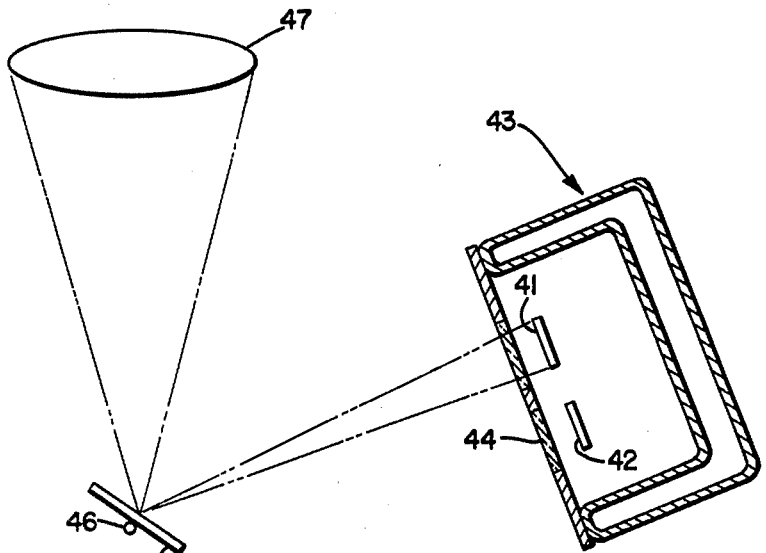
FIG. 2 is a partially schematic and partially perspective view of the invention as employed as a solar energy converter.

One configuration for effectively converting solar energy to electric energy is illustrated in FIG. 2, wherein solar energy alternately illuminates an array including a pair of photocapacitive cells 41 and 42, of the type disclosed supra, so that the cells are alternately irradiated and not irradiated at phases displaced from each other by 180°. To achieve the alternate illumination of cells 41 and 42, the cells are mounted in side-by-side position in a suitable container 43. Cells 41 and 42 are illuminated at phases displaced by 180° through windows 44 by solar energy reflected from oscillating mirror 45 that periodically wobbles, at frequency f, about pivot point 46 in response to being driven by a motor (not shown). Mirror 45 is positioned to be responsive to solar radiation focused on it by collecting lens 47, that is in turn positioned to be responsive to radiation from the sun. In response to the alternate irradiation of cells 41 and 42 by the solar energy reflected from mirror 45, the resistance and capacitance of cells 41 and 42 are correspondingly modulated to deliver power to a pair of load circuits, one of which is provided for each of the cells. Power derived from the load circuits can be summed together utilizing conventional transformer circuitry, or the like.

Figure 3:
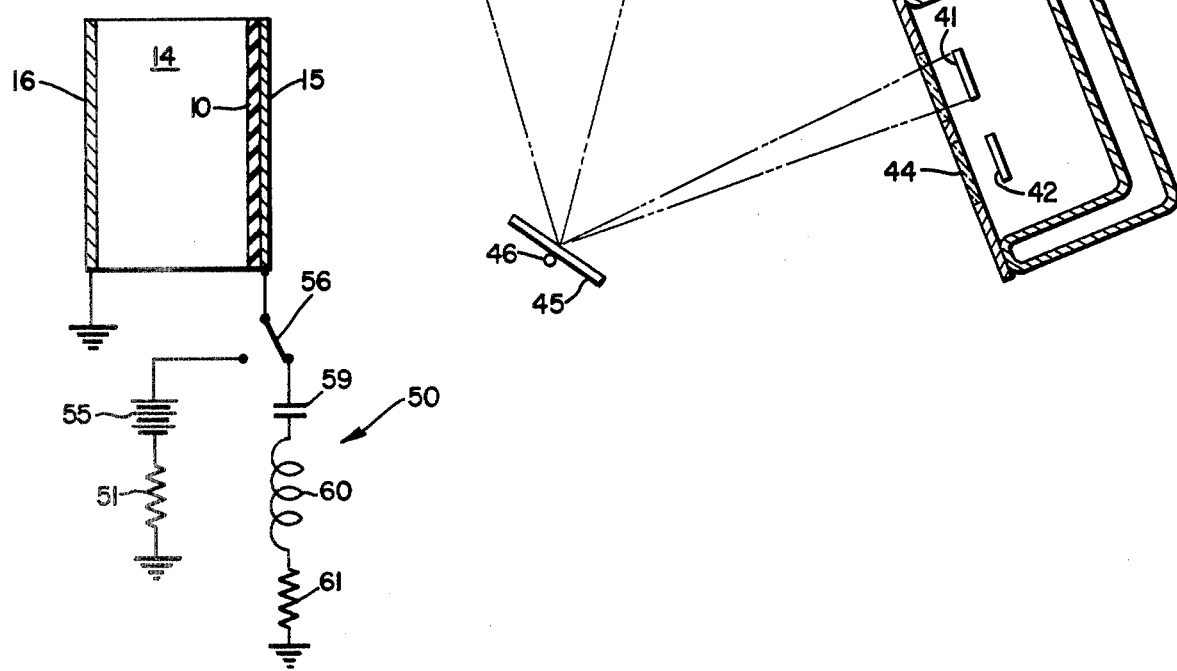
FIG. 3 is a schematic diagram of one solar energy converter and its load.

To achieve maximum transfer of current from cells 41 and 42, the cells are preferably connected to a matched load impedance through a resonance circuit. A preferred configuration for initially charging one of the cells, cell 41, and for supplying power from the cell to the matched load circuit is shown in FIG. 3. Cell 41 is initially charged to the voltage of DC power supply 55 by a circuit provided through double pole, single throw switch 56 and current limiting resistor 57. The voltage of source 55 is selected in accordance with the same criteria mentioned above with regard to the selection of the amplitude of the voltage of source 18, FIG. 1.

After a charge has been applied by the voltage of source 55 to cell 41, switch 56 is activated to disconnect source 55 from cell 41 and to connect load circuit 58 in series with the cell. Load circuit 58 includes a DC blocking capacitor 59 that prevents the charge on cell 41 from discharging into the remainder of the load circuit which consists of a series inductance 50 and resistive load impedance 61. Blocking capacitor 59 has a value, $C_L$, much larger than the static capacitance, $C_o$, of cell 41, while inductor 60 is selected to have an inductance L, necessary to resonate the series circuit at the illumination frequency of cell 41, for the static capacitance of the cell. In particular, the value of inductance 60 is selected in accordance with:

$$L = C_o - C_L/\omega^2 C_o C_L$$

which is approximately equal to $$1/\omega^2 C_o,$$

where:

$\omega = 2\pi f$, and f = the oscillation frequency of mirror 45.

To achieve maximum power transfer to load impedance 61, cell 41 is matched to the load circuit, whereby the static resistance, $R_o$, of cell 41, equals the resistance of conductor 50 and the resistive value of impedance 61.

While there have been described and illustrated several specific embodiments of the invention, it will be clear that variations in the details of the embodiments specifically illustrated and described may be made without departing from the true spirit and scope of the invention as defined in the appended claims. For example, operational amplifiers, as described in my previously mentioned application, Ser. No. 631,689, can be used in lieu of an inductance to provide the resonating impedance for the circuit of FIG. 4. Also, it is possible to mount an array of power converting cells in a housing including reflecting walls so that virtually all of the solar energy coupled into the housing is ultimately absorbed by the radiation responsive faces of a device.

What is claimed is:

1. A device for converting radiant energy into electric energy comprising a capacitor responsive to the radiant energy, said capacitor comprising a layer of an intrinsic semiconductor, an insulating layer on the semiconductor layer, a pair of contacts for said capacitor, said contacts, insulating layer and semiconductor layer being such that no junction barrier layer exists between the contacts; means responsive to the radiant energy for cyclically irradiating an interface between the insulating layer and the semiconductor to modulate the capacitance between the contacts, said energy having a wavelength with photon energy greater than the band gap of the semiconductor, and means for connecting a load to be responsive to current supplied by the capacitor in response to the capacitance modulation.

2. The device of claim 1 further including means for initially applying a voltage between said contacts so that an electric field is established across said insulating layer and a depletion layer is established in said semiconductor layer in proximity to a surface of the semiconductor layer abutting the insulating layer.

3. The device of claim 1 wherein the means for cyclically irradiating causes the dielectric to be periodically irradiated at a predetermined frequency, and the means for connecting includes means for resonating said capacitor to said frequency.

4. The device of claim 1 wherein the capacitor has a predetermined series, static resistance, and said load has an impedance value approximately equal to the static resistance.

5. The device of claim 1 wherein the insulating layer has a thickness enabling it to be transparent to the radiation so that radiation passes through the insulating layer to the interface.

6. The device of claim 5 wherein one of the contacts covers at least a portion of the insulating layer, said one contact being transparent to the radiation.

7. The device of claim 1 wherein the insulating layers are oxides of the semiconductor.

8. The device of claim 7 wherein the semiconductor is silicon.

9. The device of claim 1 wherein the insulating layer is lanthanum trifluoride or some other superionic conductor forming blocking contacts.

10. The device of claim 1 wherein the semiconductor has a Debye shielding length abutting said insulating layer much greater than the thicknesses of the insulating layer.

11. The device of claim 1 wherein the insulating layer is anodized.

12. The device of claim 1 wherein the semiconductor is selected from the group consisting of PbSnTe, InSb, CdHgTe, InAs, PbSe, and PbS.

13. The device of claim 1 wherein the semiconductor is selected from the group consisting of Ge, GaAs, and Si.

14. A device for converting radiant energy into electric energy comprising a capacitor responsive to the radiant energy, said capacitor comprising a layer of an effectively intrinsic semiconductor, an insulating layer on the semiconductor layer, a pair of contacts for the capacitor, said contacts, insulating layer and semiconductor layer being such that no junction barrier layer exists between the contacts; means responsive to the radiant energy for cyclically irradiating an interface between the insulating layer and the semiconductor to modulate the capacitance between the contacts, said energy having a wavelength with photon energy greater than the band gap of the semiconductor, and means for connecting a load to be responsive to current supplied by the capacitor in response to the capacitance modulation.

15. The device of claim 14 wherein the layer is formed of a semiconductor doped with deep donors or acceptors to a concentration of approximately $10^{17}$ to $10^{18}$ per cm$^3$.

16. The device of claim 14 wherein the layer is formed of a semiconductor doped with shallow donors or acceptors to a concentration of approximately $10^{13}$ to $10^{14}$ per cm$^3$.

17. The device of claim 14 wherein the semiconductor is doped with a concentration of donors or acceptors so that the doped charged carrier concentration is much greater than the intrinsic charged carrier concentration.

18. The device of claim 14 further including means for initially applying a voltage between said contacts so that an electric field is established across said insulating layer and a depletion layer is established in said semiconductor layer in proximity to a surface of the semiconductor layer abutting the insulating layer.

19. The device of claim 18 wherein the depletion layer has a thickness less than the thickness of the semiconductor layer.

20. The device of claim 14 wherein one of the contacts has a thickness enabling it to be transparent to the radiation so the radiation passes through the insulating layer to the interface.

21. The device of claim 20 wherein one of the contacts covers at least a portion of the insulating layer, said one contact being transparent to the radiation.

22. The device of claim 14 wherein the means for cyclically irradiating causes the dielectric to be periodically irradiated at a predetermined frequency, and the means for connecting includes means for resonating said capacitor to said frequency.

* * * * *